(12) United States Patent
Nagata

(10) Patent No.: US 12,087,877 B2
(45) Date of Patent: Sep. 10, 2024

(54) LIGHT-EMITTING ELEMENT

(71) Applicant: TOYODA GOSEI CO., LTD., Kiyosu (JP)

(72) Inventor: Kengo Nagata, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 419 days.

(21) Appl. No.: 17/590,428

(22) Filed: Feb. 1, 2022

(65) Prior Publication Data
US 2022/0254954 A1    Aug. 11, 2022

(30) Foreign Application Priority Data
Feb. 5, 2021   (JP) ................. 2021-017635

(51) Int. Cl.
| | | |
|---|---|---|
| H01L 33/04 | (2010.01) | |
| H01L 33/00 | (2010.01) | |
| H01L 33/02 | (2010.01) | |
| H01L 33/32 | (2010.01) | |

(52) U.S. Cl.
CPC .......... *H01L 33/04* (2013.01); *H01L 33/0008* (2013.01); *H01L 33/025* (2013.01); *H01L 33/325* (2013.01)

(58) Field of Classification Search
CPC ... H01L 33/04; H01L 33/0008; H01L 33/025; H01L 33/325; H01L 33/06; H01L 33/32
See application file for complete search history.

(56) References Cited

U.S. PATENT DOCUMENTS

| | | |
|---|---|---|
| 6,936,860 B2 | 8/2005 | Sung et al. |
| 2002/0179918 A1 | 12/2002 | Sung et al. |

(Continued)

FOREIGN PATENT DOCUMENTS

| | | |
|---|---|---|
| JP | 3786898 B2 | 6/2006 |
| JP | 2013-191776 A | 9/2013 |
| JP | 2015-26731 A | 2/2015 |

(Continued)

OTHER PUBLICATIONS

Japanese Office Action, dated Nov. 7, 2023 in Japanese Application No. 2021-017635 and English Translation thereof.

(Continued)

*Primary Examiner* — Timor Karimy
(74) *Attorney, Agent, or Firm* — MCGINN I.P. LAW GROUP, PLLC

(57) ABSTRACT

A light-emitting element includes a first n-type contact layer, a light-emitting layer that is located on the first n-type contact layer and emits light at a wavelength of not less than 210 nm and not more than 365 nm, a p-type layer that includes $Al_xGa_yIn_{1-x-y}N$ ($0 \leq x+y \leq 1$, $0 \leq x$, $y \leq 1$) and is located above the light-emitting layer, a second n-type contact layer that includes $Al_xGa_yIn_{1-x-y}N$ ($0 \leq x+y \leq 1$, $0 \leq x$, $y \leq 1$), is located on the p-type layer and forms a tunnel junction with the p-type layer, an n-electrode connected to the first n-type contact layer, and a p-electrode connected to the second n-type contact layer. Band gaps of the p-type layer and the second n-type contact layer are larger than a band gap of the light-emitting layer.

5 Claims, 9 Drawing Sheets

(56) References Cited

U.S. PATENT DOCUMENTS

2014/0374698 A1* 12/2014 Tsang .................. H01L 33/32
                                                          438/26
2021/0288216 A1*  9/2021 Obata .................. H01L 33/32

FOREIGN PATENT DOCUMENTS

| JP | 2018-22814  A | 2/2018 |
| JP | 2019-087710 A | 6/2019 |
| JP | 2019-106494 A | 6/2019 |
| JP | 2019-121757 A | 7/2019 |
| JP | 2020-064955 A | 4/2020 |

OTHER PUBLICATIONS

Vol. 7, No. 5 / May 2019 / Photonics Research, pp. B7-B11.
Vol. 8, No. 3 / Mar. 2020 / Photonics Research, pp. 331-337.
Japanese Office Action, dated Feb. 13, 2024 in Japanese Application No. 2021-017635 and English Translation thereof.

* cited by examiner

LIGHT-EMITTING ELEMENT

CROSS-REFERENCE TO RELATED APPLICATIONS

The present patent application claims the priority of Japanese patent application No. 2021/017635 filed on Feb. 5, 2021, and the entire contents of Japanese patent application No. 2021/017635 are hereby incorporated by reference.

TECHNICAL FIELD

The present invention relates to a light-emitting element.

BACKGROUND ART

A light emitting-element using a tunnel junction is known (see Patent Literature 1). In the light-emitting element described in Patent Literature 1, an n-type InGaN layer is formed on a p-type GaN layer above a light-emitting layer so as to provide a tunnel junction with the p-type GaN layer, and a p-side electrode is connected using the n-type InGaN layer as a p-side contact layer. Thus, it is possible to use an n-type semiconductor for both a p-side contact layer and an n-side contact layer, allowing the same material to be used to form an n-side electrode and a p-side electrode.

CITATION LIST

Patent Literature

Patent Literature 1: JP 3786898 B

SUMMARY OF INVENTION

However, GaN or InGaN strongly absorbs light in the deep ultraviolet region due to the magnitude of its band gap. Therefore, if the configuration of the light-emitting element described in Patent Literature 1 is applied to a deep ultraviolet light-emitting element, the p-type GaN layer or the n-type InGaN layer strongly may absorb light emitted from the light-emitting layer so as to reduce the light extraction efficiency.

It is an object of the invention to provide a light-emitting element which can suppress the light absorption by the n-type layer and the p-type layer forming the tunnel junction while it uses a tunnel junction and emits deep ultraviolet light.

According to an aspect of the invention, a light-emitting element defined by (1) to (5) below can be provided.

(1) A light-emitting element, comprising:
a first n-type contact layer;
a light-emitting layer that is located on the first n-type contact layer and emits light at a wavelength of not less than 210 nm and not more than 365 nm;
a p-type layer that comprises $Al_xGa_yIn_{1-x-y}N$ ($0 \leq x+y \leq 1$, $0 \leq x$, $y \leq 1$) and is located above the light-emitting layer;
a second n-type contact layer that comprises $Al_xGa_yIn_{1-x-y}N$ ($0 \leq x+y \leq 1$, $0 \leq x$, $y \leq 1$), is located on the p-type layer and forms a tunnel junction with the p-type layer;
an n-electrode connected to the first n-type contact layer; and
a p-electrode connected to the second n-type contact layer,
wherein band gaps of the p-type layer and the second n-type contact layer are larger than a band gap of the light-emitting layer,
wherein the p-type layer comprises a high acceptor concentration layer in contact with the second n-type contact layer, and a low acceptor concentration layer that is located under the high acceptor concentration layer and has an acceptor concentration lower than that of the high acceptor concentration layer,
wherein the second n-type contact layer comprises a high donor concentration layer in contact with the p-type layer, and a low donor concentration layer that is located on the high donor concentration layer and has a donor concentration lower than that of the high donor concentration layer,
wherein a Si concentration in the high donor concentration layer is not less than $3.0 \times 10^{19}$ cm$^{-3}$ and not more than $1.0 \times 10^{21}$ cm$^{-3}$,
wherein a C concentration in the high donor concentration layer is not more than $4 \times 10^{18}$ cm$^{-3}$,
wherein a donor concentration in the low donor concentration layer is not less than $9.5 \times 10^{18}$ cm$^{-3}$ and not more than $4 \times 10^{19}$ cm$^{-3}$, and
wherein a C concentration in the low donor concentration layer satisfies at least one of following conditions: not more than 10% of the donor concentration in the low donor concentration layer and not more than $4 \times 10^{18}$ cm$^{-3}$.

(2) The light-emitting element according to (1), wherein the first and second n-type contact layers comprise Si as a donor.

(3) The light-emitting element according to (1) or (2), wherein the p-type layer comprises Mg as an acceptor.

(4) The light-emitting element according to any one of (1) to (3), wherein a total thickness of the high donor concentration layer and the high acceptor concentration layer is not less than 5 nm and not more than 100 nm.

(5) The light-emitting element according to (4), wherein a thickness of the high donor concentration layer is not less than 2.5 nm and not more than 40 nm, and wherein a thickness of the high acceptor concentration layer is not less than 3 nm and not more than 50 nm.

Effects of Invention

According to an embodiment of the invention, a light-emitting element can be provided which can suppress the light absorption by the n-type layer and the p-type layer forming the tunnel junction while it uses a tunnel junction and emits deep ultraviolet light.

DESCRIPTION OF EMBODIMENTS (Configuration of a Light-Emitting Element)

Figure 1:
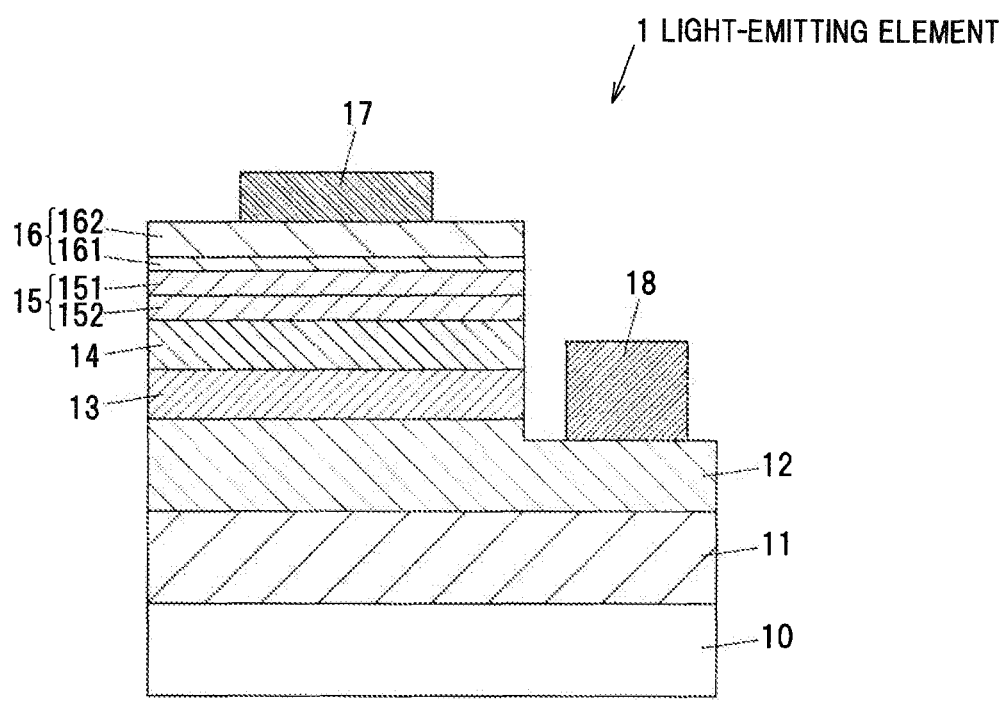
FIG. 1 is a vertical cross-sectional view showing a light-emitting element in an embodiment of the present invention.

FIG. 1 is a vertical cross-sectional view showing a light-emitting element 1 in an embodiment of the invention. The light-emitting element 1 is a flip chip-type tunnel junction light-emitting diode (LED) that emits deep ultraviolet light. The deep ultraviolet here means a wavelength range of 210-365 nm.

The light-emitting element 1 includes a substrate 10, a buffer layer 11 on the substrate 10, an n-type contact layer 12 on the buffer layer 11, a light-emitting layer 13 on the n-type contact layer 12, an electron blocking layer 14 on the light-emitting layer 13, a p-type layer 15 on the electron blocking layer 14, an n-type contact layer 16 located on the p-type layer 15 to form a tunnel junction with the p-type layer 15, a p-electrode 17 connected to the n-type contact layer 16, and an n-electrode 18 connected to the n-type contact layer 12.

"On (preposition indicating position)" in the configuration of the light-emitting element 1 is "on" when the light-emitting element 1 is placed in a direction as shown in FIG. 1, and it means a direction from the substrate 10 toward the p-electrode 17.

The substrate 10 is a growth substrate formed of sapphire. A thickness of the substrate 10 is, e.g., 900 μm. In addition to sapphire, it is possible to use AlN, Si, SiC, ZnO, etc., as a material of the substrate 10.

The buffer layer 11 has a structure in which, e.g., three layers; a nucleation layer, a low-temperature buffer layer and a high-temperature buffer layer, are sequentially stacked. The nucleation layer is a layer that is formed of non-doped AlN grown at a low temperature and is a nucleus of crystal growth. A thickness of the nucleation layer is, e.g., 10 nm. The low-temperature buffer layer is a layer that is formed of non-doped AlN grown at a higher temperature than the nucleation layer. A thickness of the low-temperature buffer layer is, e.g., 0.3 μm. The high-temperature buffer layer is a layer that is formed of non-doped AlN grown at a higher temperature than the low-temperature buffer layer. A thickness of the high-temperature buffer layer is, e.g., 2.7 μm. By providing such a buffer layer 11, a threading dislocation density in AlN is reduced.

The n-type contact layer 12 is formed of n-type $Al_xGa_yIn_{1-x-y}N$ ($0 \le x+y \le 1$, $0 \le x$, $y \le 1$) containing Si as a donor. $Al_xGa_yIn_{1-x-y}N$ is a compound of N and at least one of group III elements Al, Ga and In. The band gap of $Al_xGa_yIn_{1-x-y}N$ tends to increase according as the composition ratio of Al increases and decrease according as the composition ratio of In increases. A thickness of the n-type contact layer 12 is, e.g., 500-2000 nm.

The light-emitting layer 13 is formed of $Al_xGa_yIn_{1-x-y}N$ ($0 \le x+y \le 1$, $0 \le x$, $y \le 1$) and preferably has a multiple quantum well (MQW) structure. The composition of the light-emitting layer 13 (the composition of well layers when having the MQW structure) is set according to a desired emission wavelength in the deep ultraviolet region (210-365 nm). When, e.g., the light-emitting layer 13 is formed of AlGaN and has an emission wavelength of 270-290 nm, the Al composition ratio is set to about 40-50%. Here, the Al composition ratio (or percentage) is a proportion of an Al content relative to the total of a Ga content and the Al content.

The light-emitting layer 13 has, e.g., a MQW structure having two well layers, i.e., a structure in which a first barrier layer, a first well layer, a second barrier layer, a second well layer and a third barrier layer are stacked in this order. The first well layer and the second well layer are formed of n-type AlGaN. The first barrier layer, the second barrier layer and the third barrier layer are formed of n-type AlGaN with a higher Al composition ratio (including the Al composition ratio of 100%, i.e., AlN) than the first well layer and the second well layer.

As an example, an Al composition ratio, a thickness and a concentration of Si as a dopant for each of the first well layer and the second well layer are 40%, 2.5 nm and $9.0 \times 10^{18}$ cm$^{-3}$. An Al composition ratio, a thickness and a concentration of Si as a dopant for each of the first barrier layer and the second barrier layer are 55%, 11 nm and $9.0 \times 10^{18}$ cm$^{-3}$. An Al composition ratio, a thickness and a concentration of Si as a dopant for the third barrier layer are 55%, 5.5 nm and $5.0 \times 10^{18}$ cm$^{-3}$.

The electron blocking layer 14 is a layer to suppress diffusion of electrons to the p-type contact layer 16 side and is formed of, e.g., p-type $Al_xGa_yIn_{1-x-y}N$ ($0 \le x+y \le 1$, $0 \le x$, $y \le 1$) containing Mg as an acceptor. A thickness of the electron blocking layer 14 is, e.g., 25 nm.

The p-type layer 15 is formed of p-type $Al_xGa_yIn_{1-x-y}N$ ($0 \le x+y \le 1$, $0 \le x$, $y \le 1$) containing Mg as an acceptor. A thickness of the p-type layer 15 is, e.g., 50-500 nm. The p-type layer 15 is composed of a layer 151 (a high acceptor concentration layer) having a particularly high Mg concentration and being in contact with the n-type contact layer 16, and a layer 152 (a low acceptor concentration layer) being provided under the layer 151 and having a Mg concentration lower than that of the layer 151. A thickness of the layer 151 is, e.g., 3-50 nm.

The Mg concentration in the layer 151 is not less than $9.0 \times 10^{19}$ cm$^{-3}$ and not more than $2.0 \times 10^{20}$ cm$^{-3}$. Meanwhile, the Mg concentration in the layer 152 is not less than $1.0 \times 10^{19}$ cm$^{-3}$ and not more than $2.0 \times 10^{20}$ cm$^{-3}$.

The Mg concentrations in the layer 151 and the layer 152 are set to not less than $1.0 \times 10^{19}$ cm$^{-3}$ to reduce electrical resistance of the p-type layer 15. In this regard, the solid solubility limit of Mg in GaN or AlGaN is about $2.0 \times 10^{19}$ cm$^{-3}$ and resistance of the p-type layer 15 is lowest when the Mg concentration is about $2.0 \times 10^{19}$ cm$^{-3}$.

When the Mg concentration exceeds the solid solubility limit of $2.0\times10^{19}$ cm$^{-3}$, Mg aggregates and partial inversion of polarity (formation of inversion domain) occurs. Then, when the Mg concentration exceeds $2.0\times10^{20}$ cm$^{-3}$, the polarities of the layers 151 and 152 completely change from +C plane to −C plane. Therefore, the Mg concentrations in the layers 151 and 152 are set to not more than $2.0\times10^{20}$ cm$^{-3}$.

The n-type contact layer 16 is formed of n-type Al$_x$Ga$_y$In$_{1-x-y}$N ($0\leq x+y\leq 1$, $0\leq x$, $y\leq 1$) containing Si as a donor. A thickness of the n-type contact layer 16 is, e.g., about 50-200 nm and has an optimum value which is determined by an interference effect between light emitted from the light-emitting layer 13 and directly incident on the n-type contact layer 16 and light reflected by the p-electrode 17 and then incident on the n-type contact layer 16. Thus, the optimum value of the thickness of the n-type contact layer 16 is determined according to a wavelength of the light emitted from the light-emitting layer 13, reflectance of the p-electrode 17, a distance between the light-emitting layer 13 and the n-type contact layer 16, and a distance between the p-electrode 17 and the n-type contact layer 16, so that these lights interfere and intensify each other.

In addition, a thickness of a portion between the light-emitting layer 13 and the p-electrode 17, i.e., a total thickness of the electron blocking layer 14, the p-type layer 15 and the n-type contact layer 16 is preferably a thickness causing the light emitted from the light-emitting layer 13 and the light reflected by the p-electrode 17 to intensify each other (to form a standing wave). To achieve this, a total thickness d of the electron blocking layer 14, the p-type layer 15 and the n-type contact layer 16 is set so as to satisfy the condition nd=λ/4 (where n is a refractive index and λ is a wavelength of light), and furthermore, it is possible to obtain a thickness causing the light emitted from the light-emitting layer 13 and the light reflected by the p-electrode 17 to further intensify each other by a calculation taking into account the phase shift when reflected at the p-electrode 17 and replacing the refractive index n with a complex refractive index N=n+iκ where κ is an extinction coefficient, or by a calculation taking into account mutual intensification of oblique lights and adding 180° to the phase. The total thickness d of the electron blocking layer 14, the p-type layer 15 and the n-type contact layer 16 is preferably controlled by adjusting a thickness of the layer 152 of the p-type layer 15 which has the lowest electrical resistivity.

The n-type contact layer 16 is composed of a layer 161 (a high donor concentration layer) having a particularly high Si concentration and being in contact with the p-type layer 15, and a layer 162 (a low donor concentration layer) being provided on the layer 161 and having a Si concentration lower than that of the layer 161. A thickness of the layer 161 is, e.g., 2-50 nm.

The Si concentration in the layer 161 is not less than $3.0\times10^{19}$ cm$^{-3}$ and not more than $1.0\times10^{21}$ cm$^{-3}$. Meanwhile, the Si concentration in the layer 162 is not less than $9.5\times10^{18}$ cm$^{-3}$ and not more than $4.0\times10^{19}$ cm$^{-3}$.

By setting the Si concentration in the layer 162 to not less than $9.5\times10^{18}$ cm$^{-3}$ and not more than $4.0\times10^{19}$ cm$^{-3}$, the Fermi level and the conduction band of the n-type contact layer 16 become degenerate and a probability of tunnelling to the p-type layer 15 can be increased.

Meanwhile, when the Si concentration in the layer 162 exceeds $3.0\times10^{19}$ cm$^{-3}$, electric resistance of the n-type contact layer 16 starts to increase. It is considered that this is because complex defects of group III(Al and Ga) vacancies and Si occur. The details of the complex defects of group III vacancies and Si have not yet been revealed, but according to one theory, when Si does not enter the group III vacancy generated in the process of growing AlGaN and stays at another location, Si cannot behave as a donor (cannot emit electrons), one to three holes are emitted depending on the state, and this causes an increase in electrical resistance. Therefore, the Si concentration in the layer 162 is preferably not more than $3.0\times10^{19}$ cm$^{-3}$.

Meanwhile, a C concentration in the layer 161 is preferably not more than $4.0\times10^{18}$ cm$^{-3}$ to suppress an increase in electrical resistance of the n-type contact layer 16. A C concentration in the layer 162 preferably satisfies at least one of following conditions: not more than 10% of the Si concentration in the layer 162 and not more than $4.0\times10^{18}$ cm$^{-3}$. C in the n-type contact layer 16 is, e.g., C that is contained in a group III source material used in MOCVD and is incorporated therefrom. C in n-type AlGaInN acts as an acceptor and compensates electrons, thereby causing an increase in electrical resistance of the n-type contact layer 16. A C concentration in the n-type contact layer 16 can be controlled by, e.g., adjusting a growth pressure of the n-type contact layer 16. In this regard, the problem of electron compensation by C does not occur with materials in which C does not act as an acceptor, such as ZnO in which C acts as a donor.

As described above, the p-type layer 15 forms tunnel junction with the n-type contact layer 16. When a forward bias is applied, a width of a depletion layer at the junction between the p-type layer 15 and the n-type contact layer 16 becomes thin and electrons pass through this thin depletion layer (tunnelling). Meanwhile, due to a high level of Si doping, many complex defects of group III vacancies and Si are formed in the layer 161 which is a portion of the n-type contact layer 16 in contact with the p-type layer 15. On the other hand, due to a high level of Mg doping, defects such as vacancies are also formed in the layer 151 which is a portion of the p-type layer 15 in contact with the n-type contact layer 16. Since electrons are conducted through levels of these defects, the probability of electron tunnelling is increased by these defects (tunnelling is assisted by the defects).

The width of the depletion layer at the junction between the p-type layer 15 and the n-type contact layer 16 when applying a bias can be further reduced by setting the Si concentration in the layer 161, which is a portion of the n-type contact layer 16 in contact with the p-type layer 15, to not less than $3.0\times10^{19}$ cm$^{-3}$ and not more than $1.0\times10^{21}$ cm$^{-3}$, and it is thereby possible to reduce a drive voltage.

To suppress absorption of light emitted from the light-emitting layer 13 by the n-type contact layer 12, the p-type layer 15 and the n-type contact layer 16, band gaps of the n-type contact layer 12, the p-type layer 15 and the n-type contact layer 16 are preferably larger than a band gap of the light-emitting layer 13 (a band gap of the well layers when the light-emitting layer 13 has the MQW structure). For example, when the n-type contact layer 12, the p-type layer 15, the n-type contact layer 16 and the light-emitting layer 13 are formed of AlGaN, Al composition ratios of the n-type contact layer 12, the p-type layer 15 and the n-type contact layer 16 are preferably higher than an Al composition ratio of the light-emitting layer 13 (the Al composition ratio of the well layers when the light-emitting layer 13 has the MQW structure) and are preferably within a range of, e.g., not less than 50% and not more than 70%. In this case, the n-type contact layer 12, the p-type layer 15 and the n-type contact layer 16 ideally have a composition expressed by Al$_x$Ga$_{1-x}$N ($0.5\leq x\leq 0.7$).

When the Al composition ratios of the n-type contact layer 12, the p-type layer 15 and the n-type contact layer 16 which are formed of AlGaN are not less than 50%, it is possible to ensure a high transmittance to light at a wavelength of not less than 270 nm.

Furthermore, it is possible to ensure higher transmittance when the Al composition ratios of the n-type contact layer 12, the p-type layer 15 and the n-type contact layer 16 which are formed of AlGaN are not less than 55%, and it is possible to ensure still higher transmittance when not less than 60%.

Electrical resistance of AlGaN when the Al composition ratio is increased is substantially constant up to the Al composition ratio of 70% and starts to increase when exceeding 70%. Therefore, electrical resistance can be suppressed to a low level by setting the Al composition ratios of the n-type contact layer 12, the p-type layer 15 and the n-type contact layer 16 to not more than 70%.

A trench is provided in a part of a region on a surface of the n-type contact layer 16. The trench penetrates the n-type contact layer 16, the p-type layer 15 and the light-emitting layer 13 and reaches the n-type contact layer 12, and the n-electrode 18 is connected to a surface of the n-type contact layer 12 exposed by the trench.

In the light-emitting element 1, the n-type contact layer 12 connected to the n-electrode 18 and the n-type contact layer 16 connected to the p-electrode 17 are both formed of n-type AlGaN. Therefore, the same material can be used for a portion of the n-electrode 18 in contact with the n-type contact layer 12 and a portion of the p-electrode 17 in contact with the n-type contact layer 16. When each of the p-electrode 17 and the n-electrode 18 is formed of a single material, the same material can be used for the p-electrode 17 and the n-electrode 18.

Thus, aluminum with a high reflectance to deep ultraviolet light can be also used for the p-electrode 17 in the same manner as for the n-electrode 18. Therefore, it is preferable to used aluminum as the material of the portion of the n-electrode 18 in contact with the n-type contact layer 12 and the portion of the p-electrode 17 in contact with the n-type contact layer 16.

The p-electrode 17 and the n-electrode 18 are formed of, e.g., V/Al/NiAu or V/Al/Ru/Au. In this case, a layer of V is preferably as thin as possible to increase reflectance.

In this regard, aluminum with a low work function cannot be brought into ohmic contact with p-type AlGaN. Therefore, when the p-electrode is connected to a contact layer formed of p-type AlGaN as in conventional general light-emitting elements, aluminum cannot be used as the material of the p-electrode.

O or Ge, etc., may be used as the donor contained in the n-type contact layer 16 instead of using Si. In addition, Zn, etc., may be used instead of the acceptor contained in the p-electrode 17.

(Method for Manufacturing the Light-Emitting Element)

Next, an example of a method for manufacturing the light-emitting element 1 in the embodiment of the invention will be described. When forming each layer of the light-emitting element 1 by a vapor-phase growth method, a Ga source gas, an Al source gas and an N source gas used are, e.g., respectively trimethylgallium, trimethylaluminum and ammonia. Meanwhile, a source gas of Si as an n-type dopant and a source gas of Mg as a p-type dopant used are, e.g., respectively a silane gas and a bis (cyclopentadienyl) magnesium gas. In addition, a carrier gas used is, e.g., a hydrogen gas or a nitrogen gas.

Firstly, the substrate 10 is prepared and the buffer layer 11 is formed thereon. When forming the buffer layer 11, the nucleation layer formed of AlN is firstly formed by sputtering. The growth temperature is, e.g., 880° C. Next, the low-temperature buffer layer and the high-temperature buffer layer, which are formed of AlN, are sequentially formed on the nucleation layer by the MOCVD method. The growth conditions for the low-temperature buffer layer are, e.g., a growth temperature of 1090° C. and a growth pressure of 50 mbar. The growth conditions for the high-temperature buffer layer are, e.g., a growth temperature of 1270° C. and a growth pressure of 50 mbar.

Next, the n-type contact layer 12 formed of AlGaN containing Si is formed on the buffer layer 11 by the MOVPE method. The growth conditions for the n-type contact layer 12 are, e.g., a growth temperature of 980° C. and a growth pressure of 50-150 mbar.

Next, the light-emitting layer 13 is formed on the n-type contact layer 12 by the MOVPE method. The light-emitting layer 13 is formed by stacking the first barrier layer, the first well layer, the second barrier layer, the second well layer and the third barrier layer in this order. The growth conditions for the light-emitting layer 13 are, e.g., a growth temperature of 975° C. and a growth pressure of 400 mbar.

Next, the electron blocking layer 14 is formed on the light-emitting layer 13 by the MOCVD method. The growth conditions for the electron blocking layer 14 are, e.g., a growth temperature of 975° C. and a growth pressure of 400 mbar.

Next, the p-type layer 15 is formed on the electron blocking layer 14 by the MOCVD method. The growth conditions for the p-type layer 15 are, e.g., a growth temperature of 975° C. and a growth pressure of 400 mbar.

Next, the n-type contact layer 16 is formed on the p-type layer 15 by the MOCVD method. The growth conditions for the n-type contact layer 16 are, e.g., a growth temperature of 980° C. and a growth pressure of 50-150 mbar.

Next, a predetermined region on the surface of the n-type contact layer 16 is dry etched and a trench with a depth reaching the n-type contact layer 12 is thereby formed.

Next, the p-electrode 17 is formed on the n-type contact layer 16 and the n-electrode 18 is formed on the n-type contact layer 12 exposed on the bottom surface of the trench. The p-electrode 17 and the n-electrode 18 are formed by sputtering or vapor deposition, etc.

Effects of the Embodiment

In the embodiment of the invention, the p-type layer 15 and the n-type contact layer 16, which have larger band gaps than the light-emitting layer 13, form a tunnel junction with each other, and the n-type contact layer 16 is used as a contact layer for the p-electrode 17. This allows a material with a high reflectance to deep ultraviolet light, such as aluminum with a low work function, to be used as a material of the p-electrode 17.

Therefore, a large percentage of the light emitted from the light-emitting layer 13 and traveling toward the p-electrode 17 is transmitted without being absorbed by the n-type contact layer 16, is efficiently reflected by the p-electrode 17 and is extracted from the substrate 10 side, hence, the light-emitting element 1 has high light extraction efficiency.

EXAMPLES

The results of various evaluations of the light-emitting element 1 in the present embodiment are shown below. Table 1 below shows the configuration of the light-emitting element 1 used for examination in this Example. In addition, Table 2 below shows the configuration of a light-emitting element as Comparative Example (referred to as a light-emitting element A) used in the examination in this Example. In Table 2, the layers constituting the light emitting element A are denoted by the reference numerals used for the corresponding layers constituting the light-emitting element 1.

TABLE 1

| | | Material | Al composition ratio | Thickness | Si concentration [cm$^{-3}$] | Mg concentration [cm$^{-3}$] |
|---|---|---|---|---|---|---|
| n-type contact layer 16 | Layer 162 | AlGaN | 60% | 209 nm to 275 nm | $2.0 \times 10^{19}$ | — |
| | Layer 161 | AlGaN | 60% | 40 nm | $6.0 \times 10^{19}$ to $1.2 \times 10^{21}$ | — |
| p-type layer 15 | Layer 151 | AlGaN | 50 to 60% | 50 nm | — | $1.2 \times 10^{20}$ to $4.1 \times 10^{20}$ |
| | Layer 152 | AlGaN | 50 to 60% | 50 nm | — | $8.7 \times 10^{19}$ |
| Electron blocking layer 14 | | AlGaN | 85% | 25 nm | — | $2.1 \times 10^{20}$ |
| Light-emitting layer 13 | Barrier layer | AlGaN | 55% | 5.5 nm | $5.0 \times 10^{18}$ | — |
| | Well layer | AlGaN | 40% | 2.5 nm | $9.0 \times 10^{18}$ | — |
| | Barrier layer | AlGaN | 55% | 11 nm | $9.0 \times 10^{18}$ | — |
| | Well layer | AlGaN | 40% | 2.5 nm | $9.0 \times 10^{18}$ | — |
| | Barrier layer | AlGaN | 55% | 11 nm | $9.0 \times 10^{18}$ | — |
| n-type contact layer 12 | | AlGaN | 60% | 1.0 μm | $2.0 \times 10^{19}$ | — |
| Buffer layer 11 | High-temperature buffer layer | AlN | — | 2.7 μm | | |
| | Low-temperature buffer layer | AlN | — | 0.3 μm | | |
| | Nucleation layer | AlN | — | 0.01 μm | | |
| Substrate 10 | | Sapphire | — | 900 μm | | |

TABLE 2

| | | Material | Al composition ratio | Thickness | Si concentration [cm$^{-3}$] | Mg concentration [cm$^{-3}$] |
|---|---|---|---|---|---|---|
| p-type contact layer | | GaN | — | 18 nm | — | $1.0 \times 10^{20}$ |
| p-type layer | | AlGaN | 50 to 60% | 50 nm | — | $3.0 \times 10^{19}$ |
| Electron blocking layer 14 | | AlGaN | 85% | 25 nm | — | $1.9 \times 10^{20}$ |
| Light-emitting layer 13 | Barrier layer | AlGaN | 50% | 5.5 nm | $5.0 \times 10^{18}$ | — |
| | Well layer | AlGaN | 40% | 1.8 nm | $9.0 \times 10^{18}$ | — |
| | Barrier layer | AlGaN | 50% | 11 nm | $9.0 \times 10^{18}$ | — |
| | Well layer | AlGaN | 40% | 1.8 nm | $9.0 \times 10^{18}$ | — |
| | Barrier layer | AlGaN | 50% | 11 nm | $9.0 \times 10^{18}$ | — |
| n-type contact layer 12 | | AlGaN | 60% | 1.3 μm | $2.0 \times 10^{19}$ | — |
| Buffer layer 11 | High-temperature buffer layer | AlN | — | 2.7 μm | | |
| | Low-temperature buffer layer | AlN | — | 0.3 μm | | |
| | Nucleation layer | AlN | — | 0.01 μm | | |
| Substrate 10 | | Sapphire | — | 900 μm | | |

Figure 2:
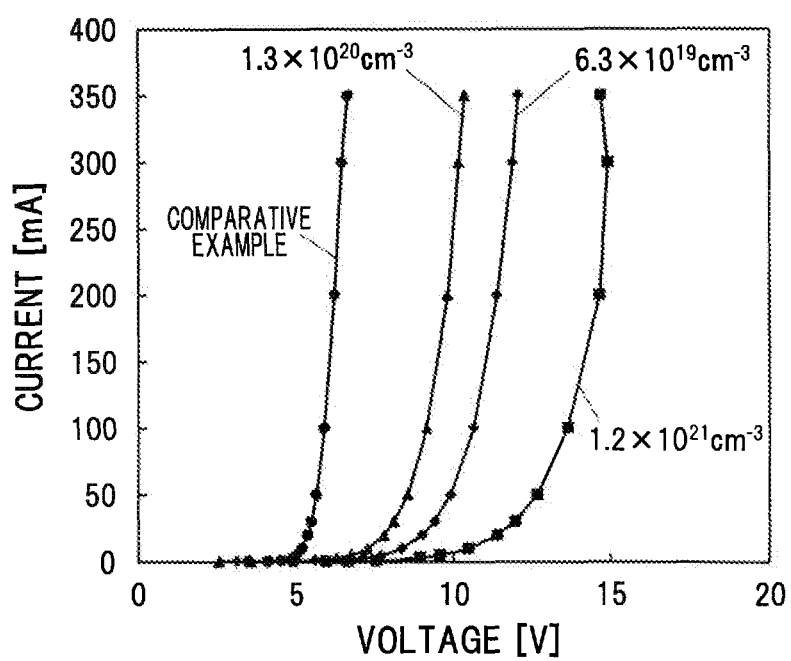
FIG. 2 is a graph showing changes in current-voltage characteristics of the light-emitting element when an Si concentration in a high donor concentration layer of an n-type contact layer is changed.

FIG. 2 is a graph showing changes in current-voltage characteristics of the light-emitting element 1 when the Si concentration in the layer 161, which is a portion of the n-type contact layer 16 in contact with the p-type layer 15, is changed. FIG. 2 also shows voltage-current characteristics of the light-emitting element A as Comparative Example. In each of the three light-emitting elements 1 pertinent to FIG. 2, the thickness of the layer 162 is 275 nm and the Al composition ratios of the layer 151 and the layer 152 are 60%. The Al composition ratios of the layer 151 and the layer 152 of the light-emitting element A pertinent to FIG. 2 are 50%.

"$6.3 \times 10^{19}$ cm$^{-3}$", "$1.3 \times 10^{20}$ cm$^{-3}$" and "$1.2 \times 10^{21}$ cm$^{-3}$" in FIG. 2 indicate the Si concentrations in the respective layers 161 of the n-type contact layers 16 of the light-emitting elements 1.

According to FIG. 2, a threshold voltage of the light-emitting element 1 was lowest when the Si concentration in the layer 161 of the n-type contact layer 16 was $1.3\times10^{20}$ cm$^{-3}$. On the other hand, the threshold voltage was highest when the Si concentration was $1.2\times10^{21}$ cm$^{-3}$ which is highest. It is considered that this is because complex defects of group III vacancies and Si occurred and electrical resistance of the n-type contact layer 16 increased.

Figure 3A:
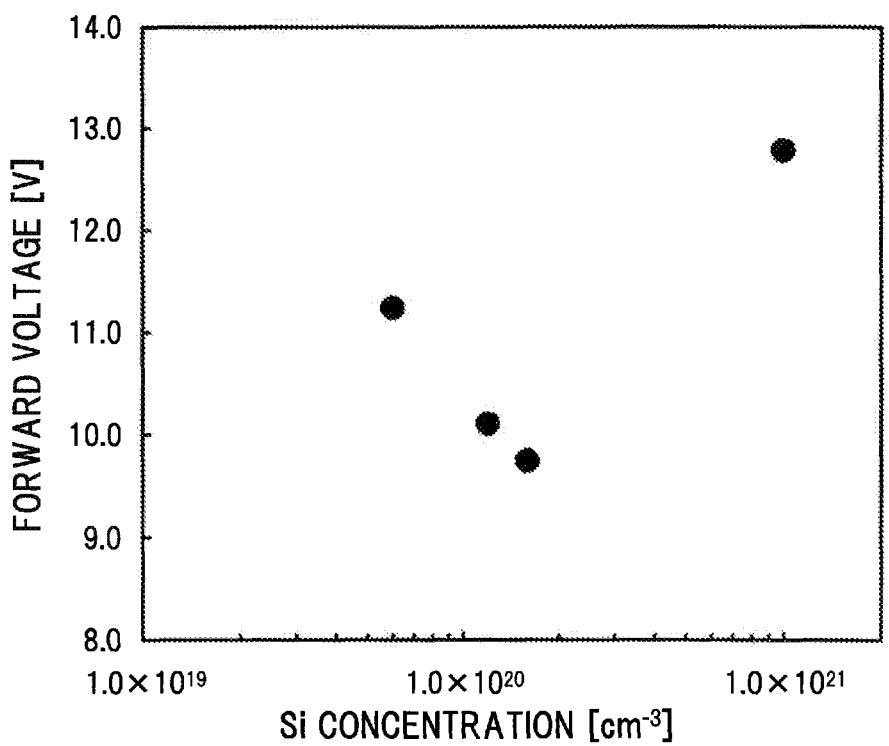
FIG. 3A is a graph showing a relationship between the Si concentration in the high donor concentration layer of the n-type contact layer and forward voltage required to pass a current of 350 mA through the light-emitting element.

FIG. 3A is a graph showing a relationship between the Si concentration in the layer 161 of the n-type contact layer 16 and forward voltage required to pass a current of 350 mA through the light-emitting element 1. In each of the four light-emitting elements 1 pertinent to FIG. 3A, the Mg concentration in the layer 151 of the p-type layer 15 is $1.7\times10^{20}$ cm$^{-3}$, the thickness of the layer 162 is 209 nm, and the Al composition ratios of the layer 151 and the layer 152 are 60%.

FIG. 3A shows that when the Si concentration in the layer 161 is increased, operating voltage of the light-emitting element 1 decreases until about $2.0\times10^{20}$ cm$^{-3}$. It is considered that this is because many defect levels were formed by Si doping and the probability of tunnelling was increased by conduction using the defect levels. Although the operating voltage of the light-emitting element 1 increases when the Si concentration exceeds $2.0\times10^2$ cm$^{-3}$, forward voltage required to pass a current of 350 mA can be kept down to about not more than 13V as long as the Si concentration is, e.g., not more than $1.0\times10^{21}$ cm$^{-3}$. Numerical values of the respective points plotted in the graph of FIG. 3A are shown in Table 3 below.

TABLE 3

| Si concentration [cm$^{-3}$] | $6.0 \times 10^{19}$ | $1.2 \times 10^{20}$ | $1.6 \times 10^{20}$ | $1.0 \times 10^{21}$ |
|---|---|---|---|---|
| Forward voltage [V] | 11.2 | 10.1 | 9.7 | 12.8 |

Figure 3B:
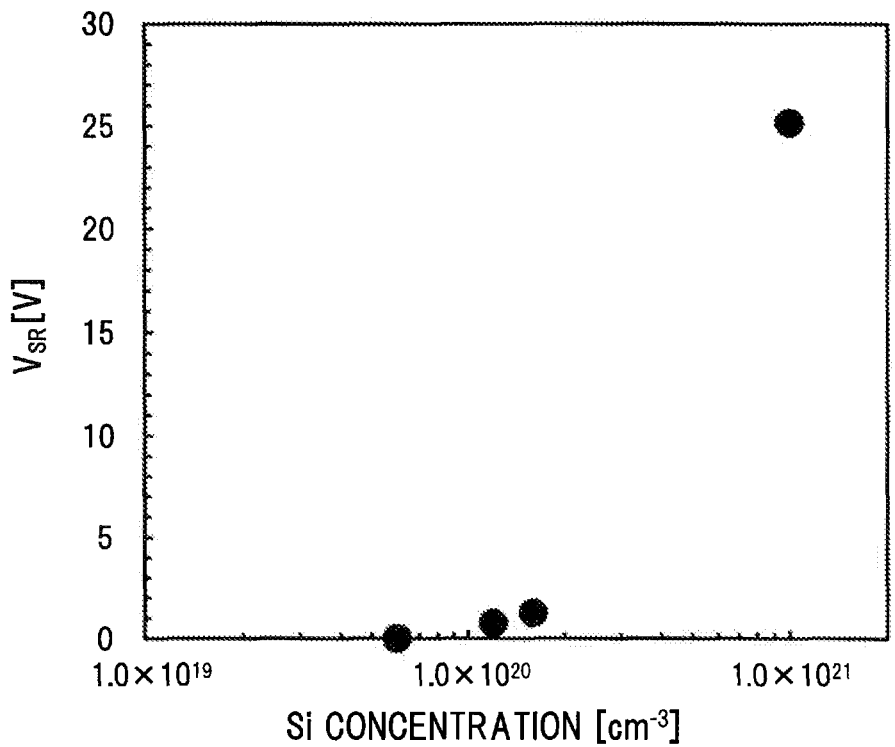
FIG. 3B is a graph showing a relationship between the Si concentration in the high donor concentration layer of the n-type contact layer and voltage $V_{SR}$ increased by series resistance of only the high donor concentration layer when a current of 350 mA is passed through the light-emitting element.

FIG. 3B is a graph showing a relationship between the Si concentration in the layer 161 of the n-type contact layer 16 and voltage $V_{SR}$ increased by series resistance of only the layer 161 when a current of 350 mA is passed through the light-emitting element 1. The four light-emitting elements 1 pertinent to FIG. 3B are the same as the four light-emitting elements 1 pertinent to FIG. 3A.

FIG. 3B shows that when the Si concentration in the layer 161 is increased, the series resistance of the layer 161 increases sharply at around the point where the Si concentration exceeds about $2.0\times10^{20}$ cm$^{-3}$. It is considered that this is because many complex defects of group III vacancies and Si were formed. Numerical values of the respective points plotted in the graph of FIG. 3B are shown in Table 4 below.

TABLE 4

| Si concentration [cm$^{-3}$] | $6.0 \times 10^{19}$ | $1.2 \times 10^{29}$ | $1.6 \times 10^{29}$ | $1.0 \times 10^{21}$ |
|---|---|---|---|---|
| $V_{SR}$ [V] | <0.1 | 0.8 | 1.3 | 25.1 |

From the results shown in FIGS. 3A and 3B, the Si concentration in the layer 161 is preferably not more than $2.0\times10^{20}$ cm$^{-3}$.

Figure 4:
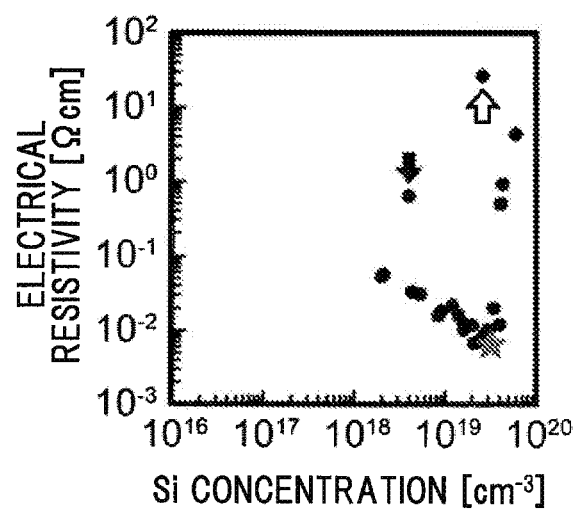
FIG. 4 is a graph showing a relationship between the Si concentration in the high donor concentration layer of the n-type contact layer and electrical resistivity of the high donor concentration layer in a thickness direction.

FIG. 4 is a graph showing a relationship between the Si concentration in the layer 161 of the n-type contact layer 16 and electrical resistivity of the layer 161 in a thickness direction. The voltage $V_{SR}$ in FIG. 3B was obtained based on the values of electrical resistivity shown in FIG. 4 (a value of the thickness of the layer 161× the electrical resistivity× the applied current is the value of voltage drop in the layer 161).

Figure 5:
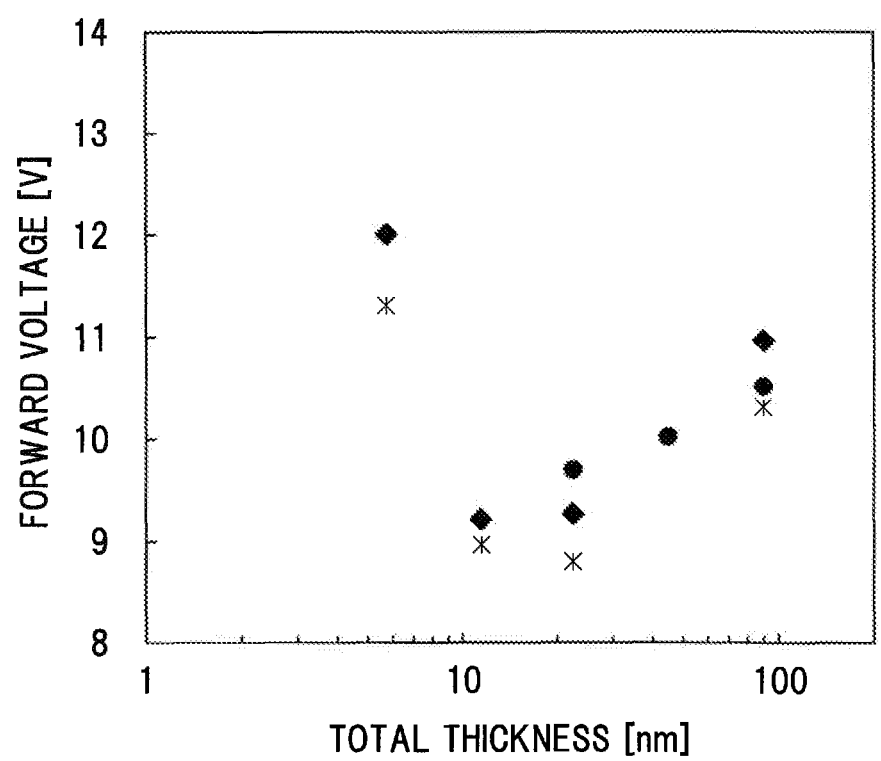
FIG. 5 is a graph showing a relationship between forward voltage required to pass a current of 350 mA through the light-emitting element and a total thickness of a high acceptor concentration layer of a p-type layer and the high donor concentration layer of the n-type contact layer.

FIG. 5 is a graph showing a relationship between forward voltage required to pass a current of 350 mA through the light-emitting element 1 and the total thickness of the layer 151 of the p-type layer 15 and the layer 161 of the n-type contact layer 16.

Here, each of the four light-emitting elements 1 plotted by the marker "*" in FIG. 5 (referred to as samples I), the four light-emitting elements 1 plotted by the marker "♦" (referred to as samples II) and the three light-emitting elements 1 plotted by the marker "●" (referred to as samples III) is formed based on the configuration of the light-emitting element 1 shown in Table 1, with some details adjusted. In the samples I, the Mg concentration in the layer 151 is $2.4\times10^{20}$ cm$^{-3}$ and the Si concentration in the layer 161 is $1.6\times10^{20}$ cm$^{-3}$. In the samples II, the Mg concentration in the layer 151 is $1.7\times10^{20}$ cm$^{-3}$ and the Si concentration in the layer 161 is $1.2\times10^{20}$ cm$^{-3}$. In the samples III, the Mg concentration in the layer 151 is $2.4\times10^{20}$ cm$^{-3}$ and the Si concentration in the layer 161 is $1.2\times10^{20}$ cm$^{-3}$. In addition, in all of the samples I to III, the Al composition ratios of the layer 151 and the layer 152 are 60%. Table 5 below shows the differences of the configurations of the samples I to III from the configuration of the light-emitting element 1 shown in Table 1.

TABLE 5

| Sample | Thickness of Layer 151 [nm] | Thickness of Layer 161 [nm] | Total thickness of Layer 151 and Layer 161 [nm] | Thickness of Layer 162 [nm] |
|---|---|---|---|---|
| I | 50 | 40 | 90 | 156 |
|  | 13 | 10 | 23 | 223 |
|  | 6.5 | 5 | 11.5 | 234 |
|  | 3.3 | 2.5 | 5.8 | 240 |
| II | 50 | 40 | 90 | 156 |
|  | 13 | 10 | 23 | 223 |
|  | 6.5 | 5 | 11.5 | 234 |
|  | 3 | 2.5 | 5.5 | 240 |
| III | 50 | 40 | 90 | 209 |
|  | 25 | 20 | 45 | 254 |
|  | 13 | 10 | 23 | 277 |

FIG. 5 shows that the operating voltage is lowest when the total thickness of the layer 151 of the p-type layer 15 and the layer 161 of the n-type contact layer 16 is about 10 nm, the forward voltage required to pass a current of 350 mA through the light-emitting element 1 is suppressed to about 12V by setting this total thickness to not less than 5 nm and not more than 100 nm, and the forward voltage required to pass a current of 350 mA through the light-emitting element 1 is suppressed to about 11V by setting to not less than 10 nm and not more than 100 nm. Numerical values of the respective points plotted in the graph of FIG. 5 are shown in Table 6 below.

TABLE 6

| Sample | Total thickness of Layer 151 and Layer 161 [nm] | Forward voltage [V] |
|---|---|---|
| I | 90 | 10.3 |
|  | 23 | 8.8 |
|  | 11.5 | 9.0 |
|  | 5.8 | 11.3 |
| II | 90 | 11.0 |
|  | 23 | 9.3 |
|  | 11.5 | 9.2 |
|  | 5.5 | 12.0 |

TABLE 6-continued

| Sample | Total thickness of Layer 151 and Layer 161 [nm] | Forward voltage [V] |
|---|---|---|
| III | 90 | 10.5 |
|  | 45 | 10.0 |
|  | 23 | 9.7 |

From the results shown in FIG. 5, the total thickness of the layer 151 of the p-type layer 15 and the layer 161 of the n-type contact layer 16 is preferably not less than 5 nm and not more than 100 nm, more preferably, not less than 10 nm and not more than 100 nm.

Figure 6:
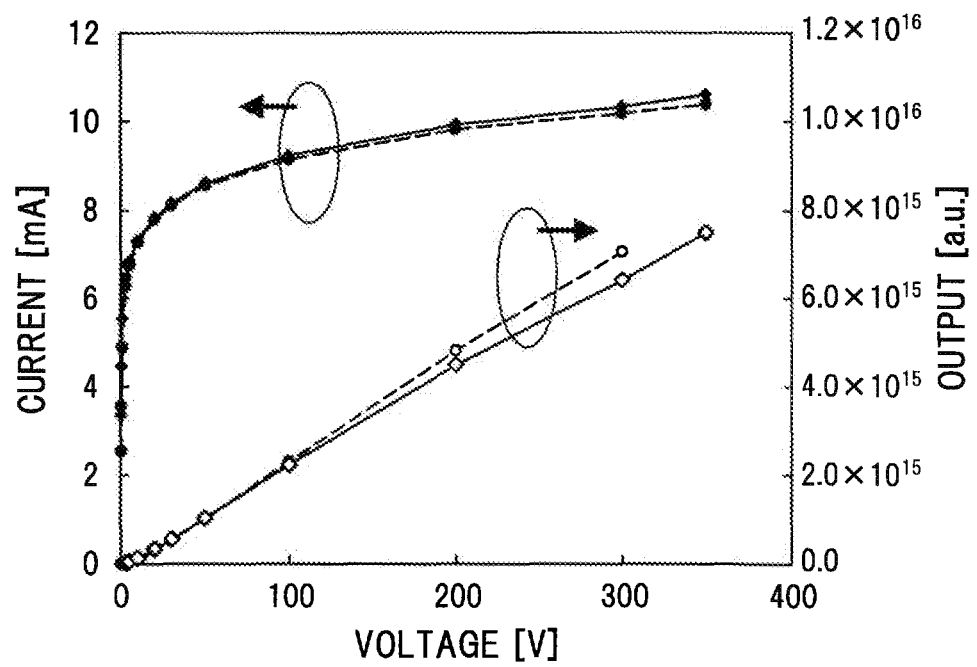
FIG. 6 is a graph showing changes in voltage-current characteristics and voltage-output characteristics of the light-emitting element when an Al composition ratio of the p-type layer is changed from 50% to 60%.

FIG. 6 is a graph showing changes in voltage-current characteristics and voltage-output characteristics of the light-emitting element 1 when the Al composition ratio of the p-type layer 15 (the layer 151 and the layer 152) is changed from 50% to 60%. In FIG. 6, dotted lines show the characteristics when the Al composition ratio of the p-type layer 15 is 50%, and solid lines show the characteristics when the Al composition ratio of the p-type layer 15 is 60%.

FIG. 6 shows that the light-emitting element 1 operates as a tunnel junction LED both when the Al composition ratio of the p-type layer 15 is 50% and when 60%.

Figure 7A:
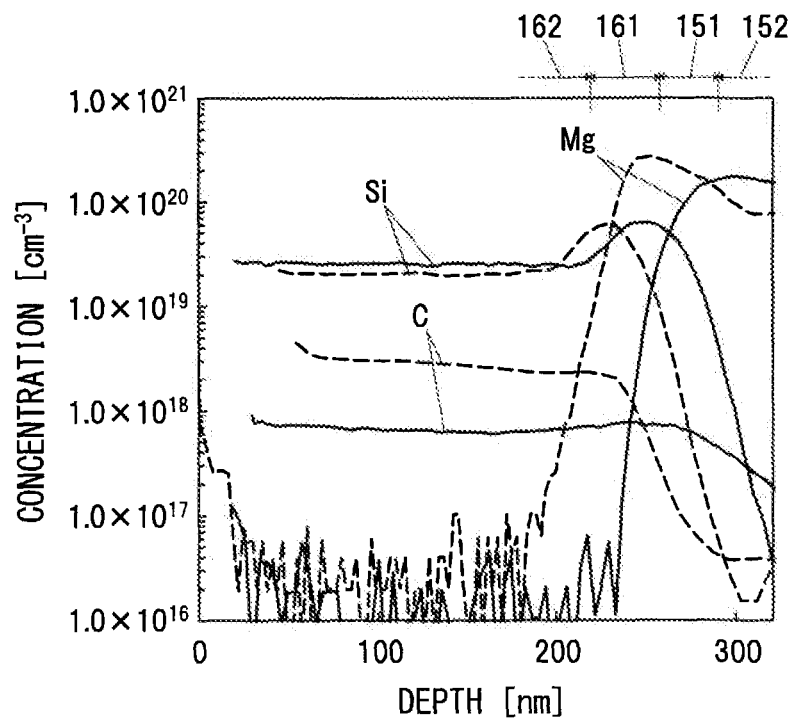
FIG. 7A is a graph showing SIMS profiles of Mg, Si and C of a light-emitting element 1.

FIG. 7A is a graph showing secondary-ion mass spectrometry (SIMS) profiles of Mg, Si and C of the light-emitting element 1. In FIG. 7A, the profiles of the elements indicated by dotted lines are profiles from the light-emitting element 1 having the n-type contact layer 16 grown at a growth pressure of 50 mbar, and the profiles indicated by solid lines are profiles from the light-emitting element 1 having the n-type contact layer 16 grown at a growth pressure of 100 mbar.

In FIG. 7A, the ranges indicated by "151" and "152" are ranges respectively corresponding to the layer 151 and the layer 152 of the p-type layer 15, and the ranges indicated by "161" and "162" are ranges respectively corresponding to the layer 161 and the layer 162 of the n-type contact layer 16. These ranges can be identified since the concentrations of Al, Si and Mg change.

According to FIG. 7A, the C concentrations in the layer 161 and the layer 162 of the n-type contact layer 16 grown at a growth pressure of 50 mbar are respectively about $2 \times 10^{18}$ cm$^{-3}$ and about $3 \times 10^{18}$ cm$^{-3}$, and the C concentrations in the layer 161 and the layer 162 grown at a growth pressure of 100 mbar are about $7 \times 10^{17}$ cm$^{-3}$. From this, it is understood that the C concentration can be controlled by the growth pressure of the n-type contact layer 16.

Figure 7B:
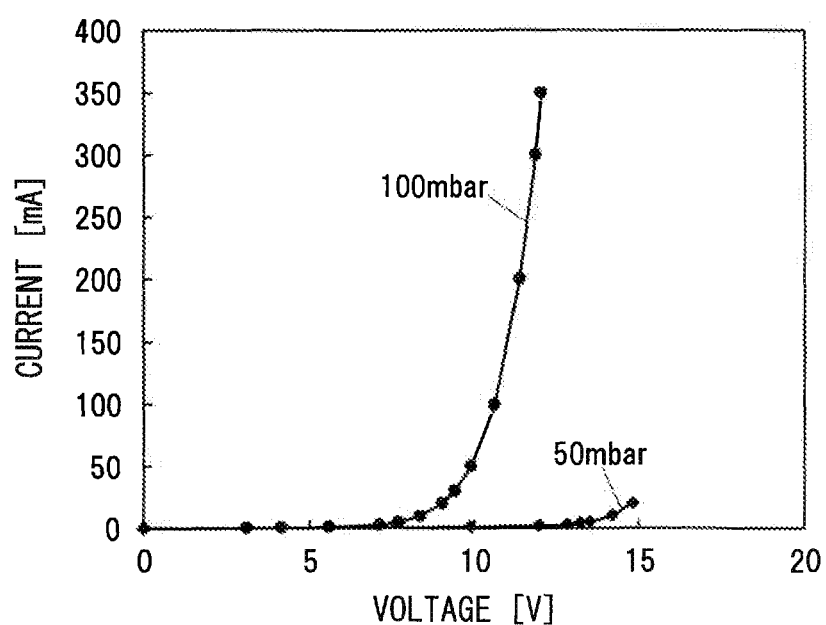
FIG. 7B is a graph showing voltage-current characteristics of a light-emitting element having an n-type contact layer grown at a growth pressure of 50 mbar and a light-emitting element having an n-type contact layer grown at a growth pressure of 100 mbar.

FIG. 7B is a graph showing voltage-current characteristics of the light-emitting element 1 having the n-type contact layer 16 grown at a growth pressure of 50 mbar and the light-emitting element 1 having the n-type contact layer 16 grown at a growth pressure of 100 mbar.

FIG. 7B shows that the light-emitting element 1 can operate with a higher current when growing the n-type contact layer 16 at a growth pressure of 100 mbar than when growing the n-type contact layer 16 at a growth pressure of 50 mbar. It is considered that this is because the C concentration in the n-type contact layer 16 was lower when the the n-type contact layer 16 is grown at a growth pressure of 100 mbar, hence, electron compensation was suppressed and the carrier concentration in the n-type contact layer 16 increased since, and the probability of tunnelling through the layer 161 of the n-type contact layer 16 and the layer 151 of the p-type layer 15 was thereby increased.

Figure 8A:
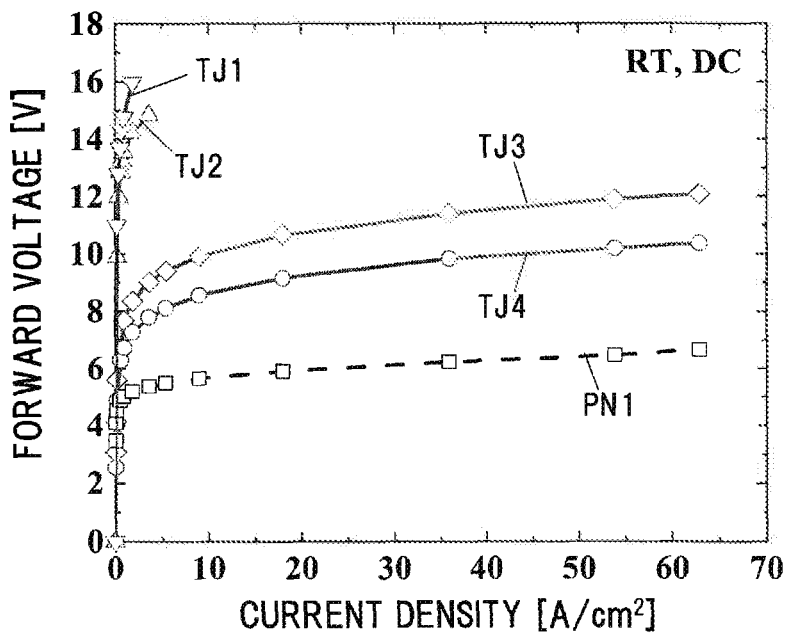
FIGS. 8A and 8B are graphs showing a relationship between forward voltage applied to samples TJ1-TJ5 and the samples PN1, PN2 and current density.
Figure 8B:
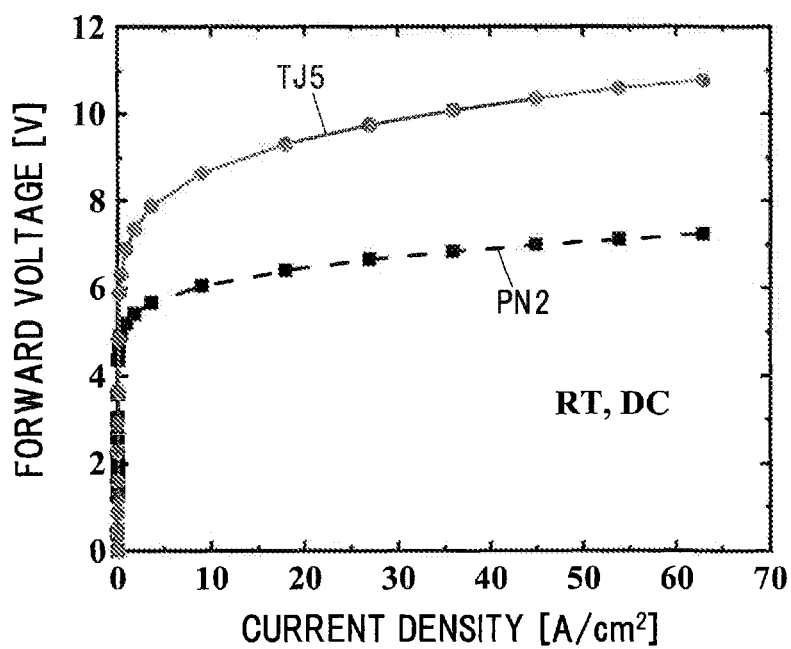

FIGS. 8A and 8B are graphs showing a relationship between forward voltage applied to five light-emitting elements 1 (samples TJ1-TJ5) and current density. FIGS. 8A and 8B also show a relationship between forward voltage applied to two light-emitting elements (samples PN1 and PN2) which has a normal p-n junction forming no tunnel junction and current density, as Comparative Example.

Here, the configuration of the samples TJ1-TJ5 are based on the configuration of the light-emitting element 1 shown in Table 1, with some details adjusted. The configuration of the samples PN1 and PN 2 are based on the configuration of the light-emitting element A shown in Table 2, with some details adjusted. Table 7 below shows the differences of the configurations of the samples TJ1-TJ5 from the configuration of the light-emitting element 1 shown in Table 1, and the differences of the configurations of the samples PN1 and PN 2 from the configuration of the light-emitting element A shown in Table 2. The samples TJ4 and TJ5 are respectively the same as the light-emitting element 1 having the p-type layer 15 with an Al composition ratio of 50% and the light-emitting element 1 having the p-type layer 15 with an Al composition ratio of 60% which are pertinent to FIG. 6. The samples TJ1 and TJ3 are respectively the same as the light-emitting element 1 having the n-type contact layer 16 grown at a growth pressure of 50 mbar and the light-emitting element 1 having the n-type contact layer 16 grown at a growth pressure of 100 mbar which are pertinent to FIG. 7.

TABLE 7

| Sample | Layer 152 Al composition ratio | Layer 151 Al composition ratio | Layer 161 Si concentration [cm$^{-3}$] | Layer 161 C concentration [cm$^{-3}$] | Layer 162 Si concentration [cm$^{-3}$] | Layer 162 C concentration [cm$^{-3}$] |
|---|---|---|---|---|---|---|
| TJ1 | 50% | 50% | $6.2 \times 10^{19}$ | $1.8 \times 10^{18}$ | $2.2 \times 10^{19}$ | $3.0 \times 10^{18}$ |
| TJ2 | 50% | 50% | $1.3 \times 10^{20}$ | $1.8 \times 10^{18}$ | $2.2 \times 10^{19}$ | $3.0 \times 10^{18}$ |
| TJ3 | 50% | 50% | $6.3 \times 10^{19}$ | $6.5 \times 10^{17}$ | $2.6 \times 10^{19}$ | $6.5 \times 10^{17}$ |
| TJ4 | 50% | 50% | $1.3 \times 10^{20}$ | $6.5 \times 10^{17}$ | $2.6 \times 10^{19}$ | $6.5 \times 10^{17}$ |
| TJ5 | 60% | 60% | $1.3 \times 10^{20}$ | $6.5 \times 10^{17}$ | $2.6 \times 10^{19}$ | $6.5 \times 10^{17}$ |
| PN1 | 50% | — | — | — | — | — |
| PN2 | 60% | — | — | — | — | — |

According to FIG. 8, the samples TJ3 and TJ4 have better voltage-current density characteristics than the samples TJ1 and TJ2. It is considered that this is because the C concentrations in the layers 161 and 162 of the n-type contact layer 16 are low and carrier compensation is suppressed. It has been confirmed that if the Si concentration in the layer 162 is not more than $1.0 \times 10^{21}$ cm$^{-3}$, excellent voltage-current density characteristics are obtained when the C concentration in the layer 161 is not more than $4\times10^{18}$ cm$^{-3}$. It has been also confirmed that if the Si concentration in the layer 162 is not more than $4.0\times10^{19}$ cm$^{-3}$, excellent voltage-current density characteristics are obtained when the C concentration in the layer 162 satisfies at least one of following conditions: not more than 10% of the Si concentration in the layer 162 and not more than $4\times10^{18}$ cm$^{-3}$.

Figure 9:
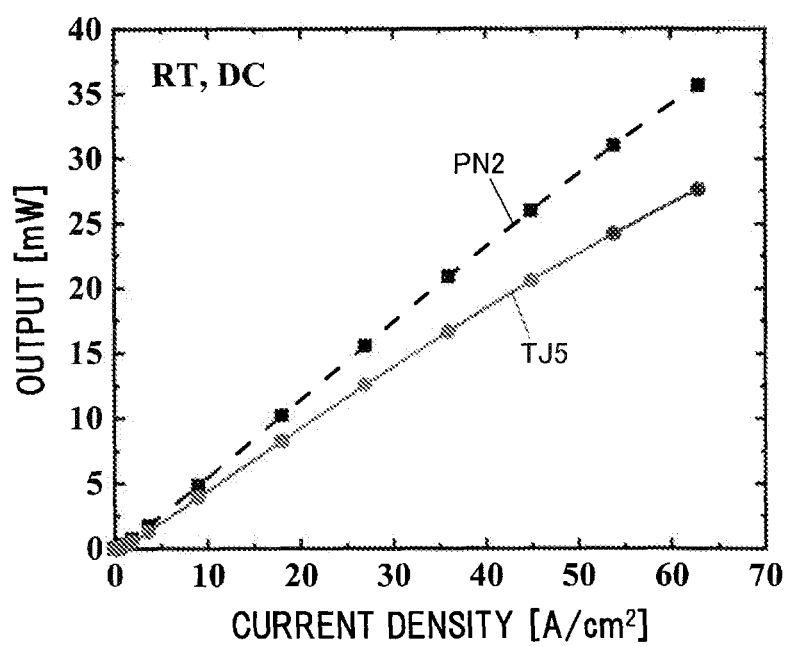
FIG. 9 is a graph showing a relationship between current density and output for the sample TJ5 and the sample PN2.

FIG. 9 is a graph showing a relationship between current density and output for the sample TJ5 and the sample PN2. According to FIG. 9, output relative to the current density is smaller in the sample TJ5 which is an example of the light-emitting element 1 than in the sample PN2 which is an example of the light-emitting element A in Comparative Example, but this is because a reflecting electrode was used as the n-electrode in the sample PN2 and a reflecting electrode was not used as the n-electrode in the sample TJ5. If a reflecting electrode is used as the n-electrode in the sample TJ5, it can be expected that output of the sample TJ5 is larger than output of the sample PN2 including GaN which absorbs light emitted from the light-emitting layer.

Although the embodiment and Examples of the invention have been described, the invention is not limited to the embodiment and Examples, and the various kinds of modifications can be implemented without departing from the gist of the invention. In addition, the constituent elements in the embodiment and Examples can be arbitrarily combined without departing from the gist of the invention.

In addition, the embodiment and Examples described above do not limit the invention according to claims. Further, please note that not all combinations of the features described in the embodiment and Examples are necessary to solve the problem of the invention.

REFERENCE SIGNS LIST

1 LIGHT-EMITTING ELEMENT
10 SUBSTRATE
11 BUFFER LAYER
12 n-TYPE CONTACT LAYER
13 LIGHT-EMITTING LAYER
14 ELECTRON BLOCKING LAYER
15 n-TYPE LAYER
151 HIGH ACCEPTOR CONCENTRATION LAYER
152 LOW ACCEPTOR CONCENTRATION LAYER
16 n-TYPE CONTACT LAYER
161 HIGH DONOR CONCENTRATION LAYER
162 LOW DONOR CONCENTRATION LAYER
17 p-ELECTRODE
18 n-ELECTRODE

The invention claimed is:

1. A light-emitting element, comprising:
a first n-type contact layer;
a light-emitting layer that is located on the first n-type contact layer and emits light at a wavelength of not less than 210 nm and not more than 365 nm;
a p-type layer that comprises $Al_xGa_yIn_{1-x-y}N$ ($0\leq x+y\leq 1$, $0\leq x, y\leq 1$) and is located above the light-emitting layer;
a second n-type contact layer that comprises $Al_xGa_yIn_{1-x-y}N$ ($0\leq x+y\leq 1$, $0\leq x, y\leq 1$), is located on the p-type layer and forms a tunnel junction with the p-type layer;
an n-electrode connected to the first n-type contact layer; and
a p-electrode connected to the second n-type contact layer,
wherein band gaps of the p-type layer and the second n-type contact layer are larger than a band gap of the light-emitting layer,
wherein the p-type layer comprises a high acceptor concentration layer in contact with the second n-type contact layer, and a low acceptor concentration layer that is located under the high acceptor concentration layer and has an acceptor concentration lower than that of the high acceptor concentration layer,
wherein the second n-type contact layer comprises a high donor concentration layer in contact with the p-type layer, and a low donor concentration layer that is located on the high donor concentration layer and has a donor concentration lower than that of the high donor concentration layer,
wherein a Si concentration in the high donor concentration layer is not less than $3.0\times10^{19}$ cm$^{-3}$ and not more than $1.0\times10^{21}$ cm$^{-3}$,
wherein a C concentration in the high donor concentration layer is not more than $4\times10^{18}$ cm$^{-3}$,
wherein a donor concentration in the low donor concentration layer is not less than $9.5\times10^{18}$ cm$^{-3}$ and not more than $4\times10^{19}$ cm$^{-3}$, and
wherein a C concentration in the low donor concentration layer satisfies at least one of following conditions: not more than 10% of the donor concentration in the low donor concentration layer and not more than $4\times10^{18}$ cm$^{-3}$.

2. The light-emitting element according to claim 1, wherein the first and second n-type contact layers comprise Si as a donor.

3. The light-emitting element according to claim 1, wherein the p-type layer comprises Mg as an acceptor.

4. The light-emitting element according to claim 1, wherein a total thickness of the high donor concentration layer and the high acceptor concentration layer is not less than 5 nm and not more than 100 nm.

5. The light-emitting element according to claim 4, wherein a thickness of the high donor concentration layer is not less than 2.5 nm and not more than 40 nm, and wherein a thickness of the high acceptor concentration layer is not less than 3 nm and not more than 50 nm.

* * * * *